United States Patent [19]

Koiwa

[11] Patent Number: 5,058,559
[45] Date of Patent: Oct. 22, 1991

[54] APPARATUS FOR IGNITING FUEL FOR INTERNAL COMBUSTION ENGINE

[75] Inventor: Mitsuru Koiwa, Hyogo, Japan

[73] Assignee: Mitsubishi Denki Kabushiki Kaisha, Tokyo, Japan

[21] Appl. No.: 533,552

[22] Filed: Jun. 5, 1990

[30] Foreign Application Priority Data

Jun. 13, 1989 [JP] Japan .............................. 1-68121[U]
Jun. 19, 1989 [JP] Japan .............................. 1-70833[U]

[51] Int. Cl.$^5$ .............................................. F02P 7/06
[52] U.S. Cl. .................................... 123/612; 123/647
[58] Field of Search ................ 123/647, 146.5 A, 612, 123/613, 617

[56] References Cited

U.S. PATENT DOCUMENTS 3,888,225  6/1975  Boyer et al. ................ 123/146.5 A

FOREIGN PATENT DOCUMENTS 54-44137  4/1979  Japan .................................. 123/647

Primary Examiner—Andrew M. Dolinar
Attorney, Agent, or Firm—Sughrue, Mion, Zinn, Macpeak and Seas

[57] ABSTRACT

An improved apparatus for igniting fuel for an internal combustion engine wherein a rotor for a signal generator, a signal pickup located opposite to said rotor and a controlling section for the signal pickup are accommodated in a housing for a distributor, the housing being made of electrically conductive material and earthed, and the controlling section includes a heat sink arranged in a heat-transmitting relationship relative to the housing and a hybrid IC placed on the housing in a frame for the controlling section, the frame being made of non-electrically conductive material. Signal lead wires extending from the signal pickup and the frame for the controlling section are firmly secured together to the housing for the distributor by the tightening screws, and one of the signal lead wires is earthed via a tightening screw and the housing for the distributor. Similarly, an earthing pattern on the hybrid IC is earthed via the terminal plate, a tightening screw and the housing for the distributor.

7 Claims, 4 Drawing Sheets

APPARATUS FOR IGNITING FUEL FOR INTERNAL COMBUSTION ENGINE

BACKGROUND OF THE INVENTION

1. Technical Field of the Invention

The present invention relates generally to an apparatus for igniting fuel for an internal combustion engine. More particularly, the present invention relates to an improvement of an apparatus for igniting fuel for an internal combustion engine wherein a controlling section for an igniter including a hybrid IC is firmly secured to a housing for a distributor, one of the signal lead wires extending from a signal pickup is earthed and moreover an earthing pattern on the hybrid IC is earthed via the distributor housing.

2. Description of the Background Art

A conventional apparatus for igniting fuel for an internal combustion engine including a hybrid IC is constructed such that one of the lead wires extending from a signal pickup located opposite to a rotor of a signal generator is earthed and moreover an earthing pattern on the hybrid IC is also earthed via a housing for a distributor. However, the conventional apparatus as constructed in the above-described manner is problematic in that an earthing circuit is constituted of many components and fabrication of the apparatus necessitates the expenditure of many manhours and provides low reliability at a high cost.

In a case where the earthing pattern on the hybrid IC is electrically connected to a heat sink by wire bonding or via a lead wire, the kind of material required for the heat sink is limited only to a specific material. Additionally, it is required that the heat sink is subjected to particular surface treatment, e.g., plating.

The conventional apparatus will be described further below with reference to FIGS. 4 to 6.

FIG. 4 is a wiring diagram which illustrates a controlling section of an igniter for the conventional apparatus.

In response to an ignition timing signal outputted from a signal generator, the controlling section is activated such that the signal is transmitted to an ignition coil 25 via a wave form correcting circuit 22, a drive circuit 23 and a power transistor 24. As is apparent from the drawing, one of the lead wires 21 extending from the signal generator 20 is earthed. The apparatus includes a power supply source 26 which is electrically connected to the respective components.

Referring to FIGS. 5 and 6 which illustrate the conventional apparatus, a frame 5 for the igniter controlling section 3 molded of non-electrically conductive synthetic resin is firmly secured to an electrically conductive housing 1 for a distributor by a plurality of tightening screws 4 via a heat sink 2 placed on the distributor housing 1 which is earthed. A hybird IC 6 is arranged in the frame 5 in contact with the heat sink 2. The frame 5 is closed by a cover 7.

Signal lead wires such as 21 extending from a signal pickup 14 located opposite to a rotor 13 for the signal generator 20 are fixed to the non-electrically conductive frame 5 by a plurality of tightening screws 16 in cooperation with the corresponding nuts 17 along with washers 15 and a terminal plate 11. As shown in FIG. 6, the signal lead wire 21 is electrically connected to the housing 1 via the terminal plate 11, a lead wire 10 soldered to an earthing pattern 8 on the hybrid IC 6, a connecting piece 9 and the heat sink 2.

As far as the conventional apparatus as shown in FIGS. 4 to 6 is concerned, an earthing circuit for the lead wires 21 is constructed such that electrical connection is made in accordance with the following steps: connecting the signal lead wire 21—tightening of the terminal plate 11 by the tightening screws 16—welding or soldering of the terminal plate 11 to the lead wire 10—soldering of the lead wire 10 to the earthing pattern 8 on the hybrid IC 6—bonding of the earthing pattern 8 to the heat sink 2—contacting of the heat sink 2 with the frame 5 by the tightening screws 4.

With such a construction, there arise problems that the apparatus is unavoidably constituted of many components with a large number of manhours being expended with only a low level of reliability being obtained a high cost.

As is best seen in FIG. 6, the earthing pattern 8 on the hybrid IC 6 is connected to the heat sink 2 via a wire bonding represented by reference numeral 9. Alternatively, soldering may be substituted for the wire bonding 9. In this case, the earthing pattern 8 on the hybrid IC 6 is connected to the heat sink 2 via the soldering so that the heat sink 2 is earthed via the housing 1 which is held in contact with the heat sink 2. With the conventional apparatus as constructed in that way, since the earthing pattern 8 on the hybrid IC 6 is electrically connected to the housing 1 via the wire bonding or soldering 9 and the heat sink 2, the kind of material required for the heat sink 2 is limited only to a specific material due to necessity for the wire bonding or soldering for the lead wire. Otherwise, it is required that the heat sink 2 is subjected to particular surface treatment, e.g., plating.

SUMMARY OF THE INVENTION

The present invention has been made with the foregoing background in mind.

An object of the present invention is to provide an apparatus for igniting fuel for an internal combustion engine wherein the number of earthing/connecting locations for signal lead wires is reduced and the apparatus is fabricated with improved reliability at an inexpensive cost.

Another object of the present invention is to provide an apparatus for igniting fuel for an internal combustion engine wherein the kind of material required for a heat sink is not limited only to a specific material and the heat sink is not required to receive particular surface treatment.

To accomplish the above objects, there is provided according to one aspect of the present invention an improved apparatus for igniting fuel for an internal combustion engine wherein a rotor for a signal generator, a signal pickup located opposite to the rotor and a controlling section for an igniter are accommodated in a housing for a distributor, the housing being made of electrically conductive material and earthed, and the controlling section includes a heat sink arranged in a heat-transmitting relationship relative to the housing and a hybrid IC on the heat sink in a frame for the controlling section, the frame being made of non-electrically conductive material, wherein signal lead wires extending from the signal pickup and the frame for the controlling section are firmly secured to the housing by a plurality of tightening screws, whereby the lead wires are earthed via the tightening screws and the housing.

The lead wires, the frame for the controlling section and the heat sink are firmly secured together to the housing for the controlling section by the tightening screws.

A plurality of washers, outer ends of the signal lead wires and the frame for the controlling section are firmly secured together to the housing for the distributor by the tightening screws.

Further, according to another aspect of the present invention, at least part of a terminal plate made of electrically conductive material is received in the frame, an outer end of the terminal plate and the frame are firmly secured to the housing by a plurality of tightening screws and an inner end of the terminal plate is electrically connected to an earthing pattern on the hybrid IC, whereby the earthing pattern on the hybrid IC is earthed via the terminal plate, the tightening screws and the housing.

An outer end of the terminal plate, the frame for the controlling section and the heat sink are firmly secured together to the housing for the distributor by the tightening screws.

An outer end of the terminal plate and the frame for the controlling section are firmly secured together to the housing for the distributor by the tightening screws.

In addition, a lead wire is connected to the earthing pattern on the hybrid IC so that the lead wire is connected to an inner end of the terminal plate.

Other objects features and advantages of the present invention will become apparent from the following description which has been made with reference to the accompanying drawings.

BRIEF DESCRIPTION OF THE DRAWINGS

The present invention is illustrated in the following drawings in which.

DESCRIPTION OF THE PREFERRED EMBODIMENT

Figure 1:
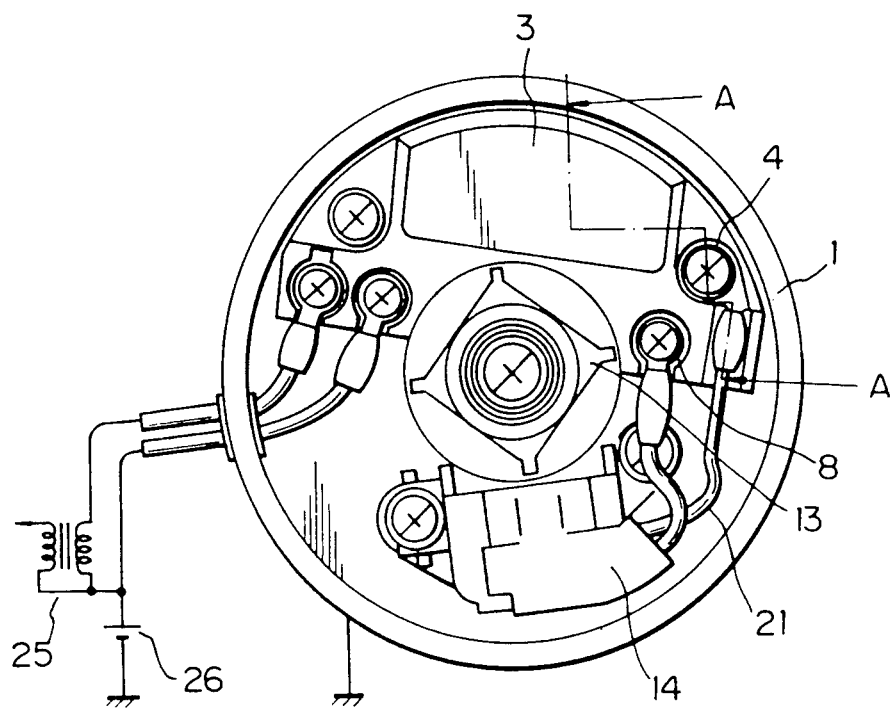
FIG. 1 is a plan view of an apparatus for igniting fuel for an internal combustion engine in accordance with an embodiment of the present invention.

Now, the present invention will be described in detail hereinafter with reference to the accompanying drawings which illustrate a preferred embodiment thereof. It should be noted that the same structural members or components throughout the drawings are represented by same reference numerals.

Figure 2:
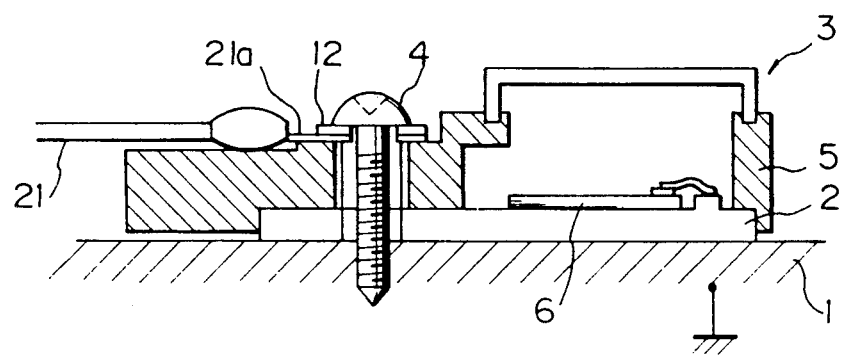
FIG. 2 is a sectional view of the apparatus taken in line A—A in FIG. 1, schematically illustrating that one of signal lead wires is earthed.

FIGS. 1 and 2 show an apparatus for igniting fuel for an internal combustion engine in accordance with the embodiment of the present invention, respectively. The apparatus includes a plurality of tightening screws 4 which serve to firmly secure a terminal 21a for one of signal lead wires 21 to be earthed and a plurality of washers 12 to a housing 1 for a distributor with a frame 5 for an igniter 3 interposed therebetween. The signal lead wire 21 is connected to the housing 1 via the tightening screw 4, whereby the signal lead wire 21 is earthed via the housing 1. An earthing circuit (not shown) for the signal lead wire 21 does not include any wire bonding location where bonding is accomplished by welding or soldering, but instead wire connection is carried out by contact provided by the tightening screws 4.

As is apparent from the above description, one of the signal lead wires is connected to the housing for the distributor by the tightening screws wherein the housing for the distributor is held in an earthed state. With such a construction, the apparatus of the present invention makes it possible to reduce the number of earthing locations where electrical connection is made for the purpose of earthing. Consequently, reliability is improved and the apparatus is fabricated at a low cost owing to the reduction in the number of components or structural members as well as the reduction in the number of manhours required for its manufacture.

Figure 3:
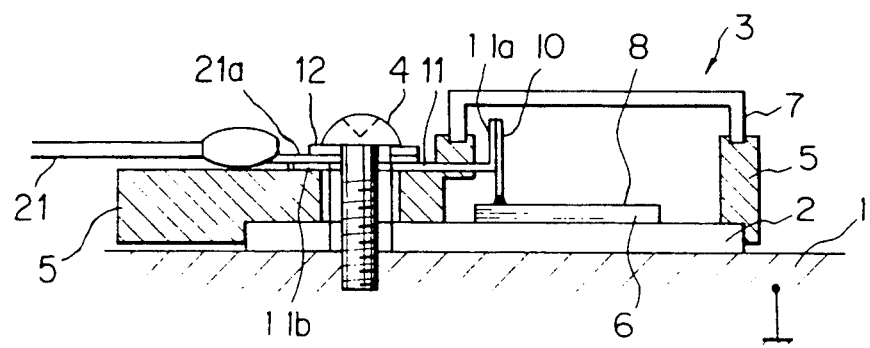
FIG. 3 is a sectional view similar to FIG. 2, particularly illustrating how an earthing pattern is earthed.
Figure 4:
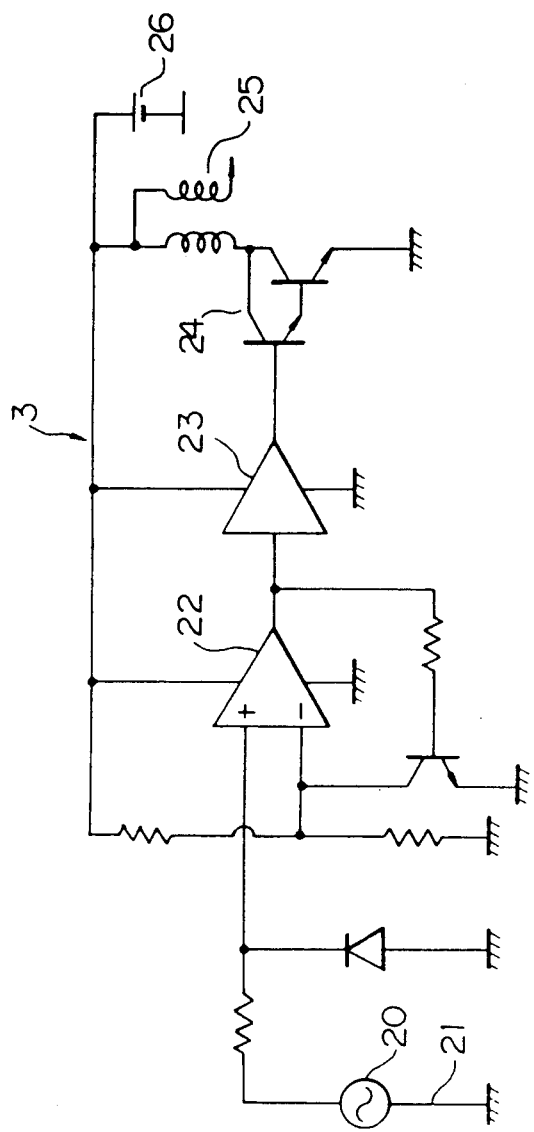
FIG. 4 is a wiring diagram for a conventional apparatus for igniting fuel for an internal combustion engine.
Figure 5:
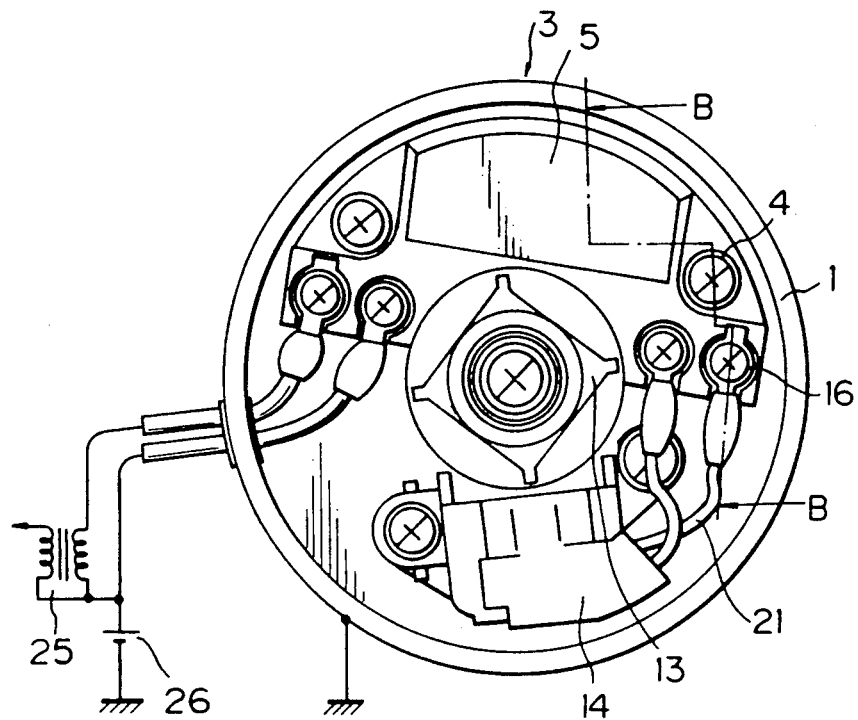
FIG. 5 is a plan view of the conventional apparatus in FIG. 4.
Figure 6:
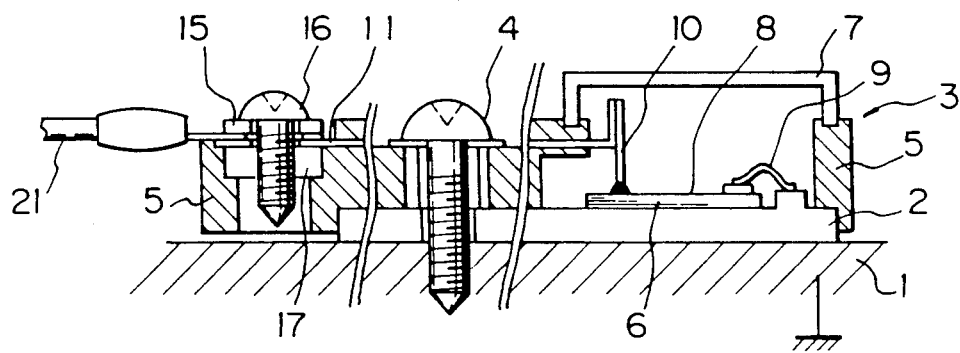
FIG. 6 is a sectional view of the conventional apparatus taken in line B—B in FIG. 5, schematically illustrating that one of signal lead wires and an earthing pattern are earthed.

FIG. 3 is a sectional view of the apparatus, similar to FIG. 2, which schematically illustrates an earthing pattern for the purpose of earthing the apparatus. The apparatus includes a lead wire 10 which is connected to an earthing pattern 8 on a hybrid IC 6. In addition, the apparatus includes a terminal plate 11 made of electrically conductive material which extends between the outside and the inside of the frame 5 for the igniter 3 such that an inner end 11a of the terminal plate 11 is connected to the lead wire 10 in the frame 5 and an outer end 11b of the terminal plate 11 is firmly secured to the upper surface of the frame 5, together with the lead wire 21 terminal 21a, by the tightening screws 4 with the washers 12 located thereunder.

The earthing pattern 8 on the hybrid IC 6 is connected to the distributor housing 1 via the lead wire 10, the terminal plate 11 and the tightening screw 4, whereby the earthing pattern 8 is earthed. Thus, since a heat sink 2 is isolated from the earthing circuit in the earthing pattern 8, material required for the heat sink 2 is not limited only to electrically conductive material and moreover no particular surface treatment is required for assuring electrical conduction and connection.

Since the earthing pattern on the hybrid IC is connected to the distributor housing via the terminal plate which connects the lead wire on the earthing pattern to the tightening screw for the igniter, no particular selecting material for the heat sink disposed for the igniter or particular surface treatment are required. Consequently, the apparatus of the present invention can be fabricated at a low cost.

While the present invention has been described above with respect to a single preferred embodiment thereof, it should of course be understood that it should not be limited only to this but various changes or modifications may be made without departure from the scope of the invention as defined by the appended claims.

What is claimed is:

1. In an apparatus for igniting fuel for an internal combustion engine wherein a rotor (13) for a signal generator, a signal pickup (14) located opposite said rotor and a controlling section (3) for an igniter are accommodated in a housing (1) for a distributor, said housing being made of electrically conductive material and earthed, and said controlling section including a heat sink (2) arranged in a heat-transmitting relationship relative to said housing and a hybrid IC (6) placed on said heat sink in a frame (5) for said controlling section, said frame being made of non-electrically conductive material, the improvement wherein a signal lead wire (21) extending from said signal pickup and said frame for said controlling section are firmly secured to said housing by a plurality of tightening screws (4), and said lead wire is earthed via one of said tightening screws and said housing.

2. The apparatus as claimed in claim 1, wherein the lead wire, the frame for the controlling section and the heat sink are firmly secured together to the housing for the distributor by the tightening screws.

3. The apparatus as claimed in claim 1, wherein a plurality of washers (12), an outer end (21a) of the signal lead wire and the frame for the controlling section are firmly secured together to the housing for the distributor by the tightening screws.

4. The apparatus as claimed in claim 1 wherein at least part of a terminal plate (11) made of electrically conductive material is received in said frame, an outer end (11b) of said terminal plate is firmly secured to said housing by said one tightening screw and an inner end (11a) of said terminal plate is electrically connected to an earthing pattern (8) on said hybrid IC, such that said earthing pattern on said hybrid IC is earthed via said terminal plate, said one tightening screw and said housing.

5. The apparatus as claimed in claim 4, wherein the outer end of the terminal plate, the frame for the controlling section and the heat sink are firmly secured together to the housing for the distributor by the tightening screws.

6. The apparatus as claimed in claim 4, wherein washers (12), the outer end of the terminal plate and the frame for the controlling section are firmly secured together to the housing for the distributor by the tightening screws.

7. The apparatus as claimed in claim 4, wherein a lead wire (10) is connected between the earthing pattern on the hybrid IC and the inner end of the terminal plate.

* * * * *